United States Patent [19]
Waitl et al.

[11] Patent Number: 5,035,483
[45] Date of Patent: Jul. 30, 1991

[54] SURFACE-MOUNTABLE OPTO-COMPONENT

[75] Inventors: Guenter Waitl; Franz Schellhorn, both of Regensburg, Fed. Rep. of Germany

[73] Assignee: Siemens Aktiengesellschaft, Munich, Fed. Rep. of Germany

[21] Appl. No.: 531,470

[22] Filed: May 31, 1990

[30] Foreign Application Priority Data

May 31, 1989 [EP] European Pat. Off. ........ 89109834.5

[51] Int. Cl.⁵ .............................................. G02B 6/42
[52] U.S. Cl. ............................... 350/96.20; 350/96.11; 357/74
[58] Field of Search ............... 350/96.11, 96.15, 96.17, 350/96.20; 357/74, 79, 80

[56] References Cited

U.S. PATENT DOCUMENTS

| | | | |
|---|---|---|---|
| 4,897,711 | 1/1990 | Blonder et al. | 357/74 |
| 4,930,857 | 6/1990 | Acarlar | 350/96.2 |
| 4,945,400 | 7/1990 | Blonder et al. | 357/74 |

FOREIGN PATENT DOCUMENTS 0206584  6/1986  European Pat. Off. .
0230336  1/1987  European Pat. Off. .
PCT/EP82/-
  00153  2/1983  PCT Int'l Appl. .

OTHER PUBLICATIONS

IBM Technical Disclosure Bulletin, vol. 20, No. 10, Mar. 1978, Lissner et al., "Solderless Connection Method", p. 4090.

"Light Emitting Chip Parts", Tetsuhiro Kiyono, vol. 6, No. 160, (E-126) [1038] Aug. 21, 1982, (Jap. Patent Abstract).

"Chip Carrier", Kiyoshi Ito, vol. 12, No. 498 (E-698) [3345], Dec. 26, 1988, (Jap. Patent Abstract).

Primary Examiner—John D. Lee
Attorney, Agent, or Firm—Hill, Van Santen, Steadman & Simpson

[57] ABSTRACT

A surface-mountable opto-component has at least one transmitter and/or receiver and is capable of being flexibly employed. The surface-mountable opto-component has at least two surfaces and at least two electrical terminals at each of these at least two surfaces so that the opto-component is optionally mountable at each of these two surfaces.

12 Claims, 2 Drawing Sheets

SURFACE-MOUNTABLE OPTO-COMPONENT

BACKGROUND OF THE INVENTION

The invention is directed to a surface-mountable opto-component. SMD (surface mounted devices) serves for a new construction technique for PC modules. It covers both a completely new type of processing for the components, namely surface mounting, as well as a new generation of components themselves that must fit the new technique.

Surface mounting will supplant the traditional technique of plug-in mounting to a greater and greater degree. Surface mounting means that unwired components are brought onto the printed circuit board instead of wired components. Components can thus be placed on both sides of the printed circuit board. Further advantages can be utilized with SMD: the PC modules become smaller, the manufacture becomes more rational, and the reliability is increased.

SMD components can be more economically employed when they are processed in automatic equipping machines. The advantages of surface mounting are all the greater the better the components, printed circuit board layout, automatic assembly, soldering technique, and testing are adapted to one another.

EP-A-0 083 627 incorporated herein by reference discloses a surface-mountable opto-component. This component is only suitable for transmitting light in the direction away from the printed circuit board or for receiving light.

SUMMARY OF THE INVENTION

An object of the present invention is to specify a surface-mountable opto-component of the type initially cited that can be flexibly utilized.

This object is achieved by a surface-mountable opto-component wherein at least one opto-transducer is provided in a housing having at least two optional mounting surfaces. Each of the two mounting surfaces has at least two electrical terminals exposed thereat so that the opto-component can be optionally surface mounted at either of these two surfaces. Preferably the two surfaces describe an angle of 90° with respect to one another so that the unit can be mounted as either a top-looker or a side-looker.

A component of the invention can be optionally mounted on a substrate on one of at least two surfaces. The possibility thus results that, dependent on the type of mounting, the opto-element of the component can receive light from different directions or can transmit light in different directions. Thus, a component of the invention can be mounted on a substrate such that it transmits or receives light only in a direction perpendicular to the substrate (top-looker or top-viewer) and, in another mounting alternative, can be mounted on a substrate such that it transmits or receives light parallel to the surface (side-looker or side-viewer).

A component of the invention can be employed in a flexible way for a reflected light barrier. In such a case, such a component contains both an optical transmitter as well as an optical receiver.

A component of the invention can transmit and/or receive infrared light or visible light.

A component of the invention can transmit and/or receive light in an arbitrary direction with respect to the surface of the substrate on which the component is mounted.

Components of the invention can be used in a simple way as a light barrier.

Components of the invention can be used in a simple way for an infrared remote control of any devices whatsoever, for example video or audio equipment.

DESCRIPTION OF THE PREFERRED EMBODIMENTS

Figure 1:
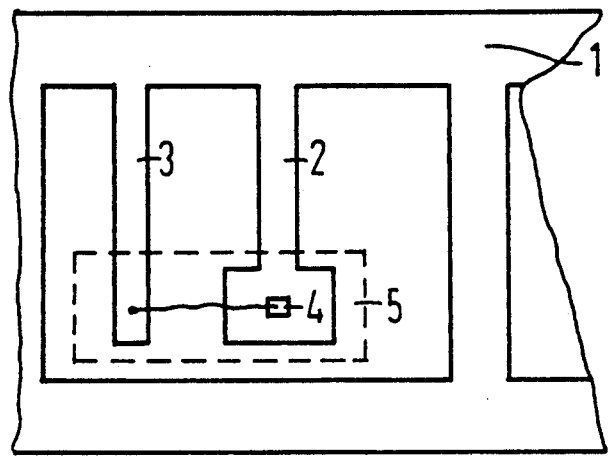
FIG. 1 explains a possible manufacture of a component of the invention.

FIG. 1 explains a possible manufacture of a component of the invention. A metallic carrier (lead frame) 1 has electrical terminals 2, 3 of the surface-mountable opto-component. Optical transmitter and/or receiver 4 (called an opto-transducer generically herein) are applied to the electrical terminal 2 and are connected to the electrical terminal 3 with the assistance of what is referred to as the bond wire technique. Only after the production of the bond wire connection are the semiconductor body, the bond wire and parts of the terminals 2, 3 coated or cast out with plastic, for example with thermoset plastics or with thermoplastics. This plastic forms the envelope or housing 5 of the surface-mountable opto-component. Finally, the electrical terminals 2, 3 are separated from the rest of the metallic carrier 1. Insofar as they project out of the housing 5, the electrical terminals 2, 3 are then bent such that they are present at at least two surfaces 6, 7 of the surface-mountable opto-component.

Figure 2:
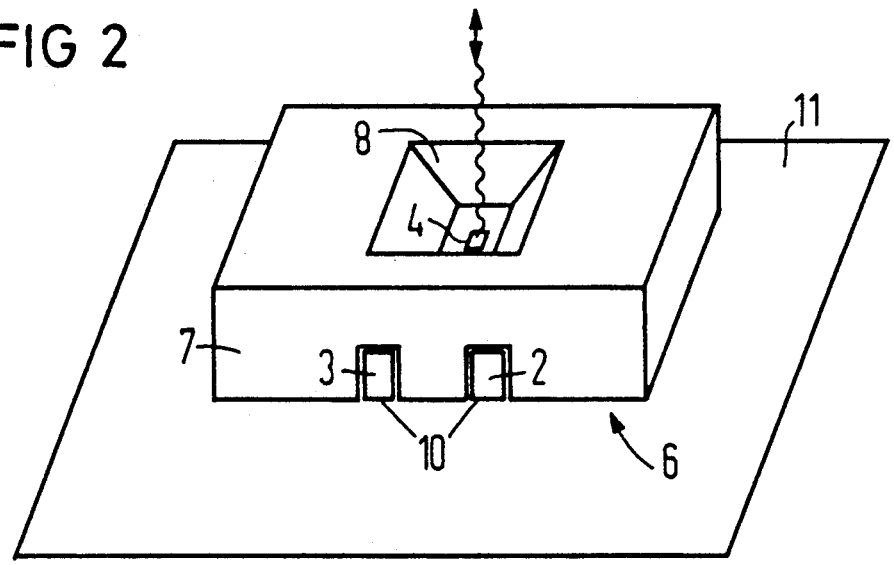
FIGS. 2 through 4 explain possible embodiments of the invention.
Figure 3:
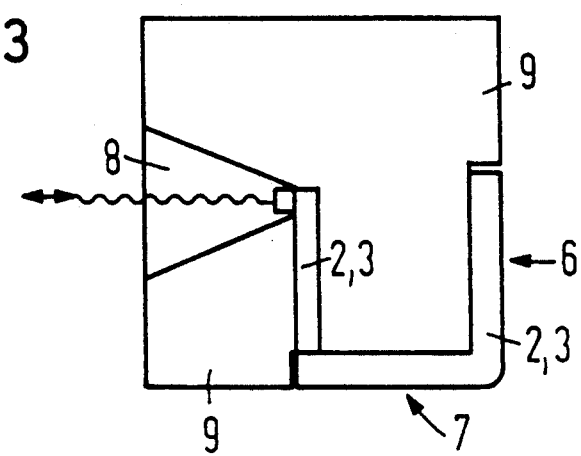
Figure 4:
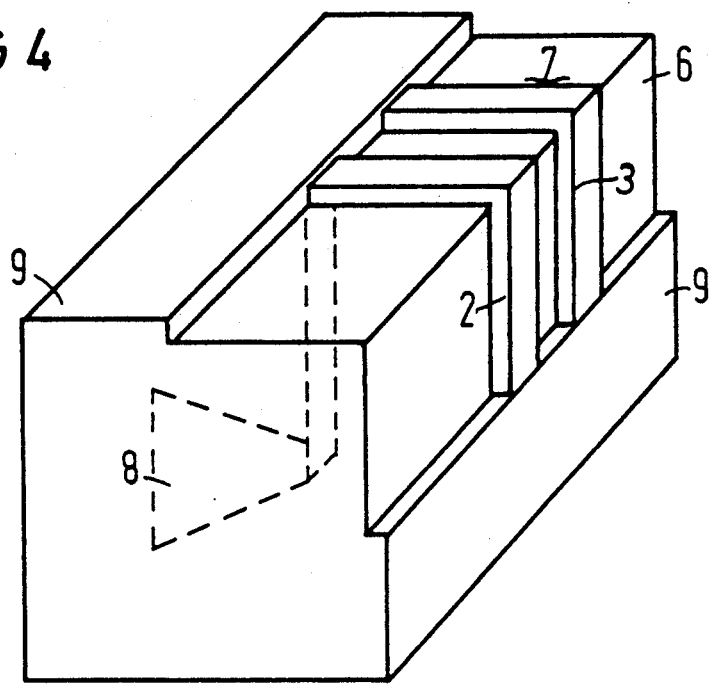

FIGS. 2 through 4 show possible embodiments of a component of the invention. Semiconductor components can be employed as an optical transmitter and/or receiver 4. However, other components can also be employed as the optical transmitter and/or receiver. Optical transmitters 4 are advantageously arranged in a cavity shaped as a reflector 8. This reflector 8 can be fashioned either as a coining or stamping in a metal carrier 2 or by being enveloped with a reflective plastic 5. A combination of coining in the metal carrier 2 and enveloping with a reflective plastic housing 5 is likewise possible.

So that a component of the invention does not tip over when being soldered onto a substrate 11, for example onto a printed circuit board, the electrical terminals 2, 3 can be arranged in depressions 10 of the surfaces 6, 7. A tipping of the component during soldering, however, can also be prevented in that spacers 9 that project out of the surfaces 6, 7 are provided at the surfaces 6, 7 of the component.

The surface-mountable component of the invention is suitable both for what is referred to as reflow soldering as well as for wave soldering.

FIG. 2 shows a component of the invention as a top-looker.

FIG. 3 shows a component of the invention as a side-looker.

FIG. 4 explains how the electrical terminals 2, 3 are conducted out of the inside of the housing 5 in the direction toward the surface 6 of a component and then cover a part of the surface 6 and are bent over at the boundary between the surfaces 6, 7 of the component and finally cover a part of the surface 7. The possibility is thus established of mounting the component both having the surface 6 as well as having the surface 7 on a substrate 11.

The component can also have more surfaces wherein respectively one surface adjoins a next surface, and whereby at least two electrical terminals extend across a plurality of surfaces.

Figure 5:
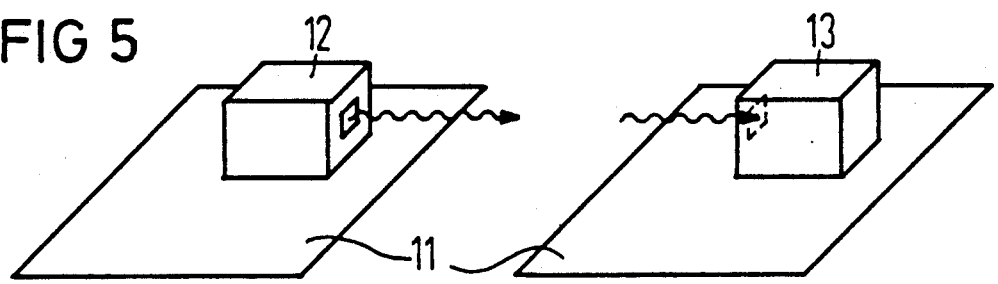
FIGS. 5 and 6 explain possible applications of the invention.

FIG. 5 shows a light barrier having an optical component as transmitter 12 and an optical component as receiver 13.

Figure 6:
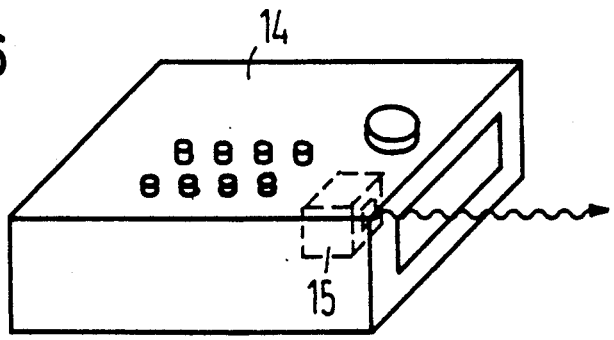

FIG. 6 schematically shows a means 14 for remote control of video or audio equipment having a component of the invention as optical transmitter 15.

The electrical terminals of the opto-component can also be designed such that these electrical terminals emerge from the envelope of the opto-component at at least two surfaces. For example, the electrical terminals 2, 3 can be designed in FIG. 1 such that two pair of electrical terminals project at two different surfaces of the housing after the electrical terminals 2, 3 are separated from the rest of the metallic carrier 1. These two pair of electrical terminals can be designed such that at least two different surfaces of the opto-component are connectable to a substrate. Such surfaces preferably successively adjoin one another.

An opto-component of the invention is preferably employed for electronic semiconductor components.

Although various minor changes and modifications might be proposed by those skilled in the art, it will be understood that we wish to include within the claims of the patent warrented hereon all such changes and modifications as reasonably come within our contribution to the art.

We claim as our invention:

1. A surface-mountable opto-component, comprising:
   at least one opto-transducer in a housing having at least two optional mounting surfaces; and
   each of the two mounting surfaces having at least two electrical terminals exposed thereat so that the opto-component can be optionally surface mounted at either of these two surfaces.

2. An opto-component according to claim 1 wherein the opto-transducer is a transmitter.

3. An opto-component according to claim 1 wherein the opto-transducer is a receiver.

4. An opto-component according to claim 1 wherein said two surfaces describe an angle of 90° with respect to one another.

5. An opto-component according to claim 1 wherein a third surface of the housing has a cavity with the opto-transducer mounted at a base of the cavity.

6. An opto-component according to claim 5 wherein the cavity comprises a reflector.

7. An opto-component according to claim 1 wherein said two surfaces join one another and describe an angle of 90° with respect to one another, and the opto-component being a top-viewer for light entering or leaving from the top when mounted at one of said surfaces and a side-viewer for light entering or leaving from the side when mounted at the other of said surfaces.

8. An opto-component according to claim 1 wherein the opto-component comprises a light barrier.

9. An opto-component according to claim 1 wherein the opto-component comprises an opto-electronic remote control of a video device.

10. A surface-mountable opto-component, comprising:
    an opto-transducer in a rectangular housing;
    first and second surfaces of the housing comprising mounting surfaces which intersect one another and form a 90° angle with one another, and a third surface opposite the first surface having a cavity therein containing the opto-transducer; and
    at least two electrical terminals at each of the first and second surfaces so that the opto-component can be optionally surface mounted as a top-viewer for light entering or exiting at the top when mounted on the first surface and as a side-viewer for light entering or exiting at the side when mounted on the second surface.

11. An opto-component according to claim 10 wherein the cavity comprises a reflector.

12. An opto-component according to claim 10 wherein the electrical terminals for the opto-transducer run from a base of the cavity where the opto-transducer is mounted to said second surface.

* * * * *